United States Patent
Kim et al.

(10) Patent No.: US 8,625,821 B2
(45) Date of Patent: Jan. 7, 2014

(54) METHOD AND APPARATUS FOR OUTPUTTING AUDIO SIGNAL

(75) Inventors: Hae-jong Kim, Seoul (KR); Hae-kwang Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 703 days.

(21) Appl. No.: 12/835,176

(22) Filed: Jul. 13, 2010

(65) Prior Publication Data

US 2011/0170719 A1 Jul. 14, 2011

(30) Foreign Application Priority Data

Jan. 8, 2010 (KR) .................. 10-2010-0001898

(51) Int. Cl.
*H04R 25/00* (2006.01)
(52) U.S. Cl.
USPC .......................................... 381/161; 381/120
(58) Field of Classification Search
USPC ................................. 381/161, 120
See application file for complete search history.

(56) References Cited

U.S. PATENT DOCUMENTS

| | | | |
|---|---|---|---|
| 4,164,714 A * | 8/1979 | Swanson | 330/10 |
| 4,580,111 A * | 4/1986 | Swanson | 332/152 |
| 5,216,376 A | 6/1993 | Swanson | |
| 7,508,463 B2 | 3/2009 | Tai | |
| 2011/0170717 A1 * | 7/2011 | Lim et al. | 381/120 |

FOREIGN PATENT DOCUMENTS

JP  2001-127562 A  5/2001

OTHER PUBLICATIONS

Communication dated Jun. 9, 2011, issued in counterpart European Patent Application No. 10189946.6.
Communication Dated Mar. 16, 2012 issued by the European Patent Office in corresponding European Application No. 10 189 946.6.

* cited by examiner

*Primary Examiner* — Jeffrey Donels
(74) *Attorney, Agent, or Firm* — Sughrue Mion, PLLC

(57) ABSTRACT

A method of outputting an audio signal includes receiving an audio signal; generating a carrier waves having phases differing from each other; generating modulation signals by comparing the respective carrier waves with the audio signal; amplifying the modulation signals; and outputting the amplified modulation signals.

21 Claims, 5 Drawing Sheets

FIG. 1
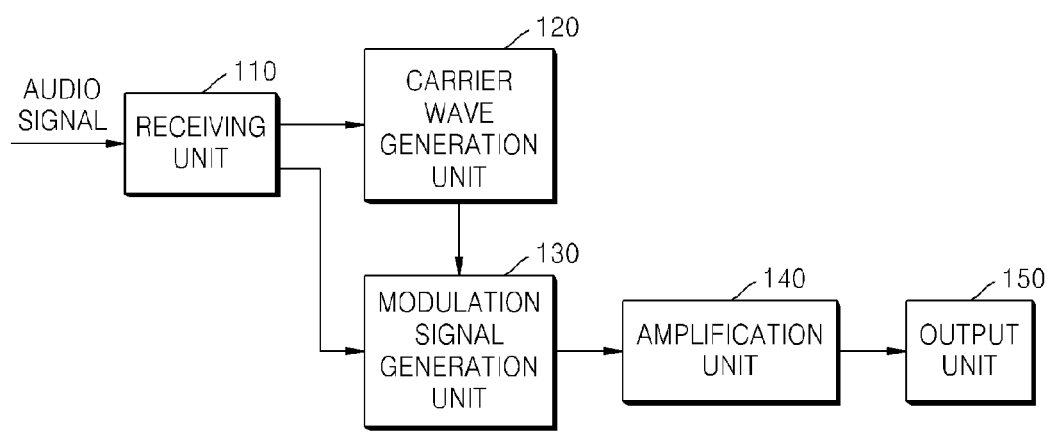
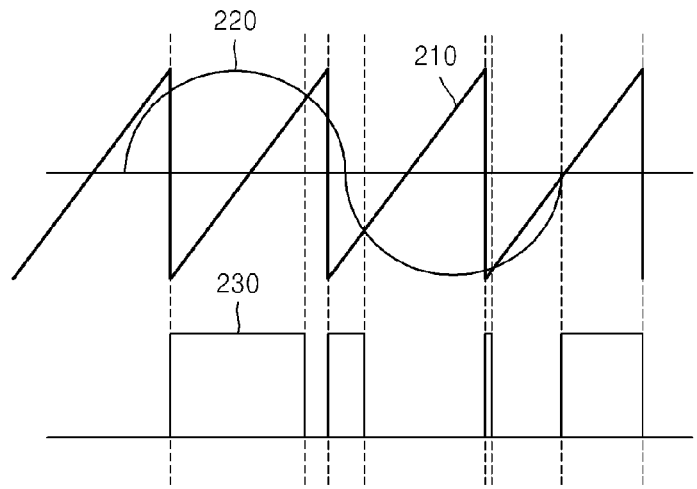
FIG. 2A
FIG. 2B

METHOD AND APPARATUS FOR OUTPUTTING AUDIO SIGNAL

CROSS-REFERENCE TO RELATED PATENT APPLICATION

This application claims priority from Korean Patent Application No. 10-2010-0001898, filed on Jan. 8, 2010, in the Korean Intellectual Property Office, the disclosure of which is incorporated herein in its entirety by reference.

BACKGROUND

1. Field

Exemplary embodiments relate to a method and an apparatus for outputting an audio signal.

2. Description of the Related Art

With the development of acoustic technologies, various techniques for outputting an audio signal have been proposed. One of the techniques is a method of converting a single audio signal into a plurality of audio signals and then outputting the plurality of audio signals through a plurality of audio output units corresponding thereto. According to this method, however, when only some specific audio output units of the plurality of audio output units continue to output audio signals for certain duration, there are performance differences between the specific audio output units continuing to output the audio signals and the other audio output units which do not operate to output audio signals. That is, the frequent use of specific audio output units leads to a problem in that the performances of the specific audio output units continuously outputting audio signals are further degraded in comparison with the performances of the other audio output units which do not operate to output audio signals.

To overcome such a problem, a method of randomly changing audio signal output units at a predetermined period using a dynamic element matching (DEM) algorithm has been proposed to prevent only specific audio output units from continuing to output audio signals. However, such a conventional method causes computation amount to be increased due to the application of the complex algorithm.

SUMMARY

Exemplary embodiments provide a method and an apparatus for outputting an audio signal.

Exemplary embodiments address the above disadvantages and other disadvantages not described above. Also, exemplary embodiments are not required to address the disadvantages described above and an exemplary embodiment may not address any of the disadvantages described above.

According to an exemplary embodiment, there is provided a method of outputting an audio signal, including receiving an audio signal; generating a plurality of carrier waves having phases differing from each other; generating a plurality of modulation signals by comparing the respective carrier waves with the audio signal; amplifying the plurality of modulation signals; and outputting the amplified modulation signals.

Each of the modulation signals may have a first logic level or a second logic level, and the generating of the modulation signals may be performed such that first logic level periods of the respective modulation signals partly overlap each other in a time domain.

In the outputting of the amplified modulation signals, the amplified modulation signals may be outputted through a speaker including a plurality of audio output units that are provided for directly outputting the respective amplified modulation signals.

The method may further include synthesizing and outputting the amplified modulation signals outputted from a plurality of voice coils when the amplified modulation signals are outputted through the plurality of voice coils.

The generating of the plurality of carrier waves may include generating an initial carrier wave; and generating phase-shifted carrier waves the phases of which are shifted from a phase of the initial carrier wave by predetermined phases, and the initial carrier wave and the phase-shifted waves all may differ in phase from one another.

In the generating of the plurality of carrier waves, a pair of carrier waves having a phase difference of 180 degrees therebetween may be generated.

The generating of the carrier waves may include determining a number of the carrier waves based on a voltage magnitude of the received audio signal; and generating the carrier waves according to the determined number.

The modulation signals may be pulse width modulation (PWM) signals.

In the generating of the modulation signals, the modulation signals may be generated such that the modulation signal has a first logic level when a voltage magnitude of the carrier wave is equal to or smaller than that of the audio signal and the modulation signal has a second logic level when a voltage magnitude of the carrier wave is greater than that of the audio signal.

According to another exemplary embodiment, there is provided an apparatus for outputting an audio signal, including a receiving unit configured to receive an audio signal; a carrier wave generation unit configured to generate a plurality of carrier waves having phases differing from each other; a modulation signal generation unit configured to generate a plurality of modulation signals by comparing the respective carrier waves with the audio signal; an amplification unit configured to amplify the plurality of modulation signals; and an output unit configured to output the amplified modulation signals.

The output unit may include a speaker including a plurality of audio output units provided for directly outputting the respective amplified modulation signals.

The output unit may include a speaker including a plurality of voice coils and an audio output unit, the plurality of voice coils outputting the amplified modulation signals respectively, and the audio output unit synthesizing and outputting the amplified modulation signals outputted from the plurality of voice coils.

According to another exemplary embodiment, there is provided a computer-readable recording medium storing a program for performing the method of outputting an audio signal, including receiving an audio signal; generating a plurality of carrier waves having phases differing from each other; generating a plurality of modulation signals by comparing the respective carrier waves with the audio signal; amplifying the plurality of modulation signals; and outputting the amplified modulation signals.

BRIEF DESCRIPTION OF THE DRAWINGS

The above and other features will become more apparent by describing in detail exemplary embodiments thereof with reference to the attached drawings, in which:

FIG. 1 illustrates an apparatus for outputting an audio signal according to an exemplary embodiment;

FIGS. 2A and 2B illustrate a method of generating one modulation signal according to an exemplary embodiment;

DETAILED DESCRIPTION

Figure 3:
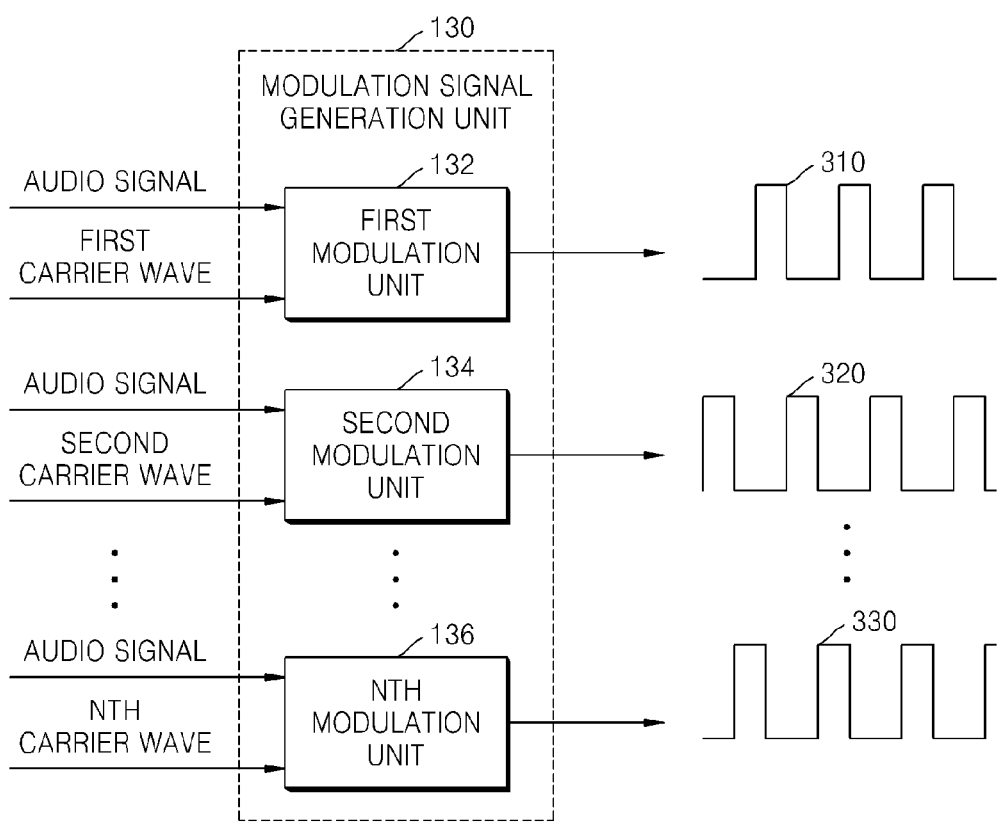
FIG. 3 illustrates a method of generating a plurality of modulation signals according to an exemplary embodiment.

Exemplary embodiments will now be described in detail with reference to the accompanying drawings.

FIG. 1 illustrates an apparatus for outputting an audio signal according to an exemplary embodiment.

Referring to FIG. 1, the apparatus for outputting an audio signal according to an exemplary embodiment includes a receiving unit 110, a carrier wave generation unit 120, a modulation signal generation unit 130, an amplification unit 140, and an output unit 150.

The receiving unit 110 receives an audio signal.

The carrier wave generation unit 120 generates a plurality of carrier waves having different phases using the audio signal received through the receiving unit 110.

For example, the carrier wave generation unit 120 may generate an initial carrier wave, and then generate phase-shifted carrier waves the respective phases of which are shifted from a phase of the initial carrier wave by predetermined phases, respectively. Here, the carrier wave generation unit 120 generates carrier waves such that the initial carrier wave and the phase-shifted carrier waves all have different phases from one another. As an exemplary embodiment, the carrier wave generation unit 120 generates an initial carrier wave, and may then generate a first phase-shifted carrier wave a phase of which is shifted from the phase of the initial carrier wave by 90 degrees, and a second phase-shifted carrier wave a phase of which is shifted from the phase of the initial carrier wave by 180 degrees.

The carrier wave generation unit 120 may determine a number of carrier waves based on a voltage magnitude of the received audio signal, and generate carrier waves according to the determined number. For example, if the voltage level of the audio signal that is currently inputted through the receiving unit 110 corresponds to volume level 3 of volume levels 1 to 10, the carrier wave generation unit 120 may generate three carrier waves based on the volume level 3. Here, phases of the three carrier waves differ from one another.

The method of determining the number of the carrier waves is not limited to the example above. For instance, the carrier wave generation unit 120 may generate the carrier waves the number of which equals the number of output units (not shown) included in the output unit 150. The range of volume levels is not limited to one of 1 to 10 as described above, and may be subdivided in increments greater or less than the numerical values of 1 to 10 in another exemplary embodiment.

The modulation signal generation unit 130 receives the audio signal, and compares the respective carrier waves generated from the carrier wave generation unit 120 with the received audio signal to thereby generate a plurality of modulation signals.

Detailed operation of the modulation signal generation unit 130 will be described later with reference to FIGS. 2A, 2B and 3.

FIGS. 2A and 2B illustrate a method of generating one modulation signal according to an exemplary embodiment.

In particular, FIG. 2A illustrates a carrier wave 210 and an audio signal 220 which are inputted to the modulation signal generation unit 130, and FIG. 2B illustrates a modulation signal 230 that the modulation signal generation unit 130 generates by comparing the carrier wave 210 with the audio signal 220. For convenience in describing the exemplary embodiment of FIGS. 2A and 2B, it is assumed that the audio signal 220 is a sinusoidal wave.

Referring to FIG. 2B, the modulation signal 230 according to an exemplary embodiment has a high level when a voltage magnitude of the carrier wave 210 is equal to or smaller than that of the audio signal 220, and has a low level when the carrier wave 210 is greater in voltage magnitude than the audio signal 220. The modulation signal 230 having a low level means that the voltage magnitude of the modulation signal is smaller than a predetermined threshold value, whereas the modulation signal 230 having a high level means that the voltage magnitude of the modulation signal is equal to or greater than the predetermined threshold value. However, the modulation signal 230 is not limited to the exemplary embodiment of FIGS. 2A and 2B. Therefore, a modulation signal according to another embodiment may have a low level when the carrier wave 210 is smaller in voltage magnitude than the audio signal 220, and may have a high level when the carrier wave 210 is greater in magnitude than the audio signal 220.

In particular, the modulation signal 230 illustrated in FIG. 2B is a pulse width modulation (PWM) signal. The modulation signal generation unit 130 of an exemplary embodiment may generate a PWM signal as illustrated in FIG. 2B, or may generate a modulation signal having different waveforms.

In FIGS. 2A and 2B, the method of generating one modulation signal has been described. Hereinafter, description will be given of a method of generating a plurality of modulation signals with reference to FIG. 3.

FIG. 3 illustrates a method of generating a plurality of modulation signals according to an exemplary embodiment.

Referring to FIG. 3, the modulation signal generation unit 130 according to an exemplary embodiment includes N number of modulation units 132, 134, . . . , and 136.

The first modulation unit 132 receives an audio signal and a first carrier wave to generate a first modulation signal 310.

The second modulation unit 134 receives the audio signal and a second carrier wave to generate a second modulation signal 320.

The Nth modulation unit 136 receives the audio signal and an Nth carrier wave to generate an Nth modulation signal 330.

Here, the first to Nth carrier waves 310 to 330 differ in phase from one another.

Also, referring to FIG. 3, high-level periods of some of the first to Nth carrier waves 310 to 330 partly overlap each other.

As such, the modulation signal generation unit 130 according to an exemplary embodiment generates modulation signals such that high-level periods of the respective modulation signals partly overlap each other in a time domain.

The amplification unit 140 amplifies the plurality of modulation signals.

More specifically, the amplification unit 140 amplifies amplitudes of voltages or currents of the plurality of modulation signals.

In general, the modulation signals do not have amplitudes of voltages or currents large enough to drive the output unit 150. For this reason, the amplification unit 140 amplifies voltages or currents of the modulation signals to drive the output unit 150. In an exemplary embodiment, the amplified modulation signals may have voltages or currents having the same magnitude.

The output unit 150 outputs the amplified modulation signal.

Detailed operation of the output unit 150 according to an exemplary embodiment will be described with reference to FIGS. 4 and 5.

Figure 4:
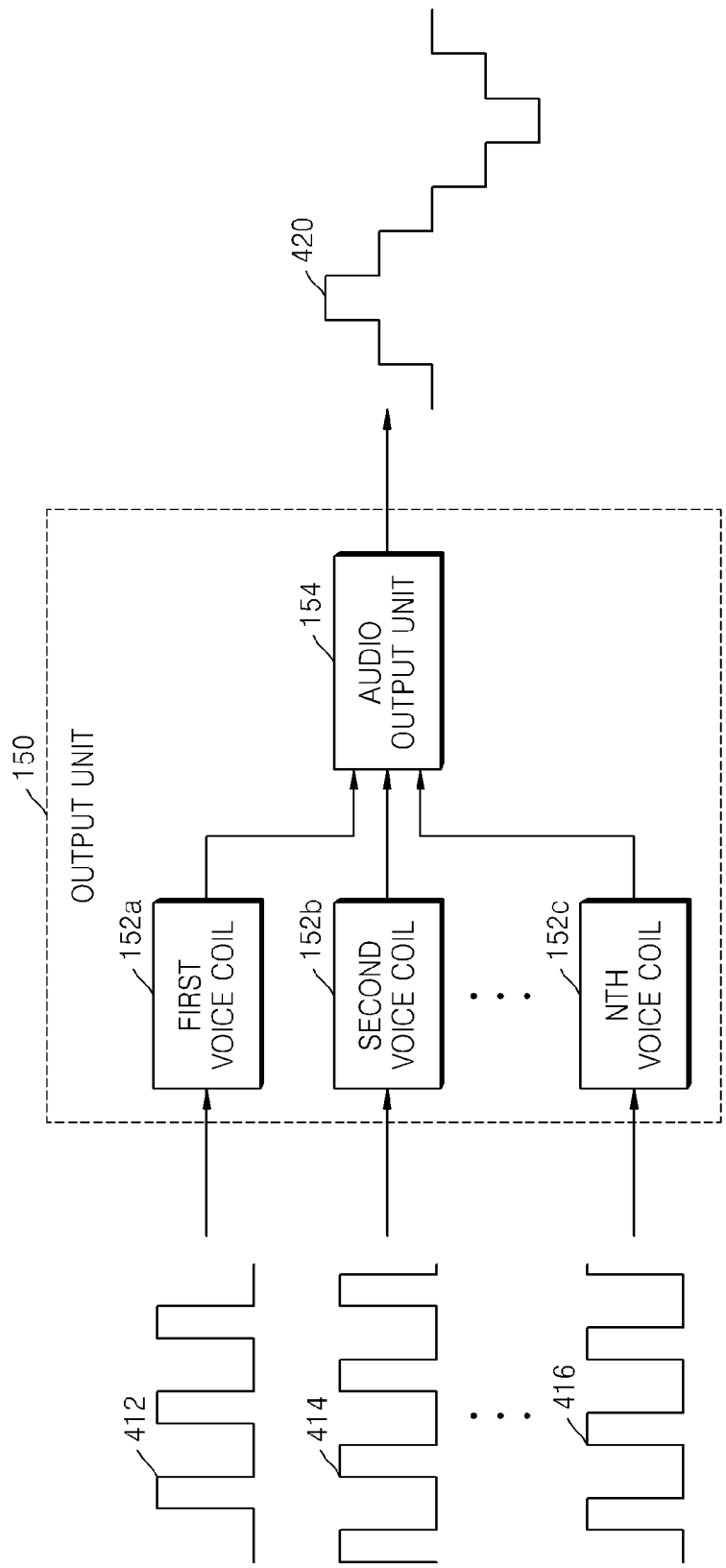
FIG. 4 illustrates the configuration of the output unit according to an exemplary embodiment.

FIG. 4 illustrates the configuration of the output unit according to an exemplary embodiment.

Referring to FIG. 4, the output unit 150 according to an exemplary embodiment includes N number of voice coils 152a, 152b, ..., and 152c, and an audio output unit 154. That is, the output unit 150 according to an exemplary embodiment may be a speaker including the N number of voice coils 152a, 152b, ..., and 152c, and the audio output unit 154.

The first voice coil 152a receives a first amplified modulation signal 412 a voltage of which is amplified by the amplification unit 140, and outputs the first amplified modulation signal to the audio output unit 154.

The second voice coil 152b receives a second amplified modulation signal 414 a voltage of which is amplified by the amplification unit 140, and outputs the second amplified modulation signal to the audio output unit 154.

The Nth voice coil 152c receives an Nth amplified modulation signal 416 a voltage of which is amplified by the amplification unit 140, and outputs the Nth amplified modulation signal to the audio output unit 154.

The audio output unit 154 synthesizes the N number of amplified modulation signals 412, 414, ..., and 416 inputted through the N number of voice coils 152a, 152b, ..., and 152c, and outputs a final output signal 420.

Since the final output signal 420 illustrated in FIG. 4 is an output signal obtained when the audio signal received by the receiving unit 110 is a sinusoidal wave, the final output signal 420 also has a waveform similar to the sinusoidal waveform of the received audio signal. Therefore, when the audio signal received by the receiving unit 110 has an arbitrary waveform instead of a sinusoidal waveform, the final output signal 420 also has the arbitrary waveform instead of the sinusoidal waveform.

In an exemplary embodiment, the N number of voice coils 152a, 152b, ..., and 152c respectively output the N number of amplified modulation signals 412, 414, ..., and 416 to the audio output unit 154 when the N number of amplified modulation signals 412, 414, ..., and 416 are at logic high. On the contrary, when the N number of amplified modulation signals 412, 414, ..., and 416 are at logic low, each of the N number of voice coils 152a, 152b, ..., and 152c does not operate, and the N number of amplified modulation signals 412, 414, ..., and 416 have high or low levels at random intervals. Accordingly, it is possible to prevent the performance difference between the voice coils 152a, 152b, ..., and 152c, which typically occurs in a conventional method and apparatus where some of the voice coils 152a, 152b, ..., and 152c continue to operate and the other voice coils do not operate.

Also, the conventional method and apparatus must use a complex algorithm such as dynamic element matching (DEM) algorithm in order to overcome the performance difference, which causes computation amount to be increased due to the application of the complex algorithm. However, according to an exemplary embodiment, the performance difference between the voice coils 152a, 152b, ..., and 152c can be prevented without the complex computation that has been necessitated in the conventional method and apparatus.

Figure 5:
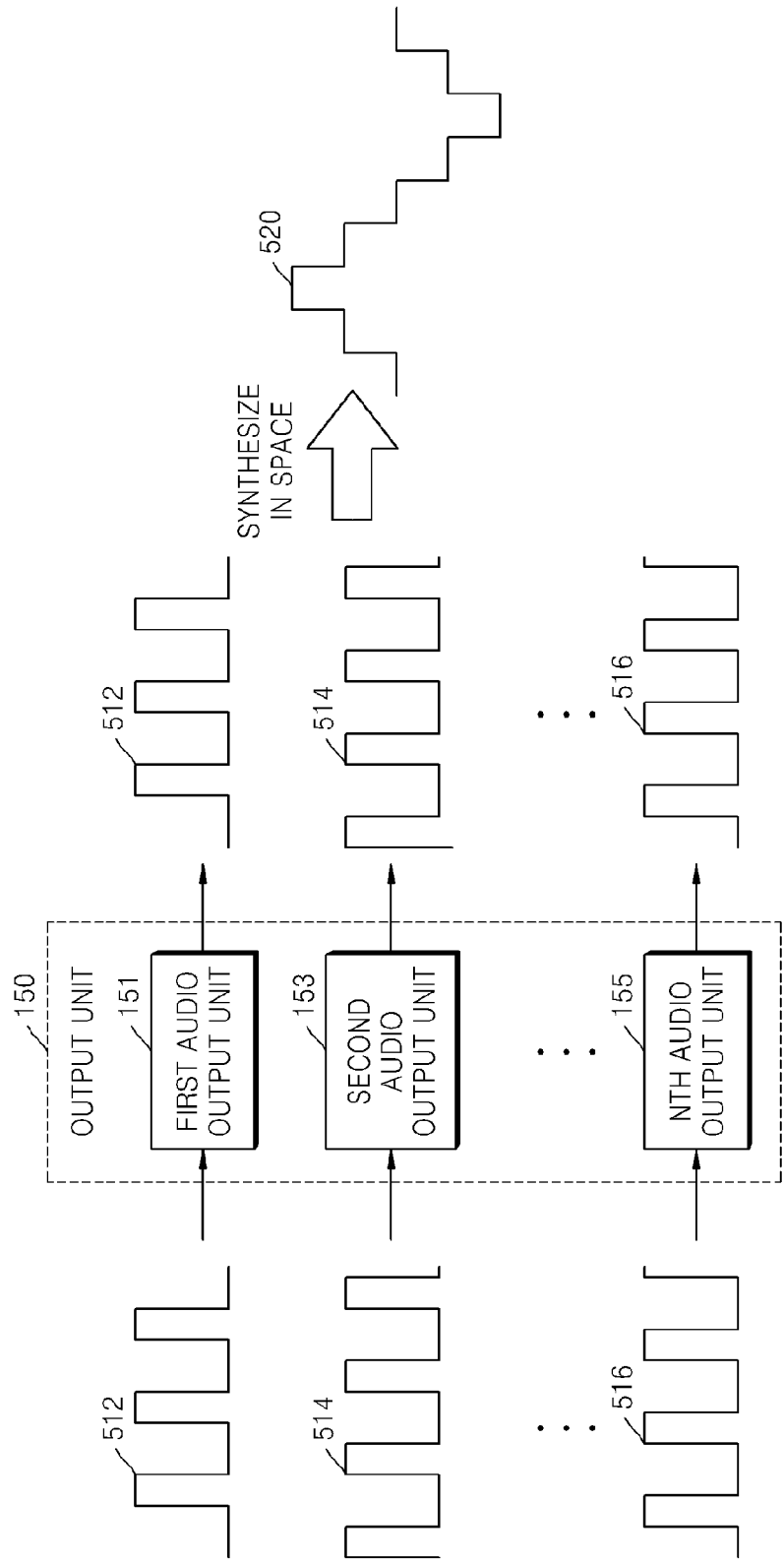
FIG. 5 illustrates the configuration of an output unit according to another exemplary embodiment.

FIG. 5 illustrates the configuration of an output unit according to another exemplary embodiment.

Referring to FIG. 5, the output unit 150 according to an exemplary embodiment includes N number of audio output units 151, 153, ..., and 155. That is, the output unit 150 according to an exemplary embodiment may be a speaker including the N number of audio output units 151, 153, ..., and 155.

The first audio output unit 151 receives a first amplified modulation signal 512 a voltage of which is amplified by the amplification unit 140, and outputs the first amplified modulation signal.

The second audio output unit 153 receives a second amplified modulation signal 514 a voltage of which is amplified by the amplification unit 140, and outputs the second amplified modulation signal.

The Nth audio output unit 155 receives an Nth amplified modulation signal 516 a voltage of which is amplified by the amplification unit 140, and outputs the Nth amplified modulation signal.

As such, when the N number of audio output units 151, 153, ..., and 155 output N number of amplified modulation signals 512, 514, ..., and 516 spatially, there is the effect that the outputted N number of amplified modulation signals 512, 514, ..., and 516 are synthesized in space. Therefore, a user located in that space recognizes that the final output signal 520, which is generated by synthesizing the N number of amplified modulation signals 512, 514, ..., and 516 through the output unit 150, is outputted.

In an exemplary embodiment, the N number of audio output units 151, 153, ..., and 155 respectively output the N number of amplified modulation signals 512, 514, ..., and 516 spatially when the N number of amplified modulation signals 512, 514, ..., and 516 are at logic high. When the N number of amplified modulation signals 512, 514, ..., and 516 are at logic low, each of the N number of audio output units 151, 153, ..., and 155 does not operate and the N number of amplified modulation signals 412, 414, ..., and 416 have high or low levels at random intervals. Accordingly, it is possible to prevent the performance difference between the audio output units 151, 153, ..., and 155, which typically occurs in a conventional method and apparatus where some of the audio output units 151, 153, ..., and 155 continue to operate and the other audio output units do not operate.

Also, the conventional method and apparatus must use a complex algorithm such as dynamic element matching (DEM) algorithm in order to overcome the performance difference, which causes computation amount to be increased due to the application of the complex algorithm. However, according to an exemplary embodiment, the performance difference between the audio output units 151, 153, ..., and 155 can be prevented without the complex computation that has been necessitated in the conventional method and apparatus.

The output unit 150 illustrated in FIGS. 4 and 5 is a speaker employing a half-bridge architecture. However, in the case where the output unit 150 in FIGS. 4 and 5 is a speaker employing a full-bridge architecture, the number of voice coils 152a, 152b, ..., and 152c included in the output unit 150 of FIG. 4, or the number of audio output units 151, 153, ..., and 155 included in the output unit 150 of FIG. 5, is reduced.

In the full-bridge architecture, the voice coils 152a, 152b, ..., and 152c, or the audio output units 151, 153, ..., and 155, may have a positive input unit and a negative input unit, wherein an amplified modulation signal inputted to the positive input unit may differ in phase by 180 degrees from an amplified modulation signal inputted to the negative input unit.

For example, a speaker having the half-bridge architecture necessitates four voice coils for outputting four amplified modulation signals, whereas the speaker having the full-bridge architecture necessitates only two voice coils for outputting four amplified modulation signals.

The carrier wave generation unit 120 according to an exemplary embodiment may generate a pair of carrier waves having a phase difference of 180 degrees therebetween.

The structure and operation of the speaker having the half-bridge architecture and the structure and operation of the speaker having the full-bridge architecture are understood by those of ordinary skill in the art, and accordingly detailed description for them will be omitted herein.

Figure 6:
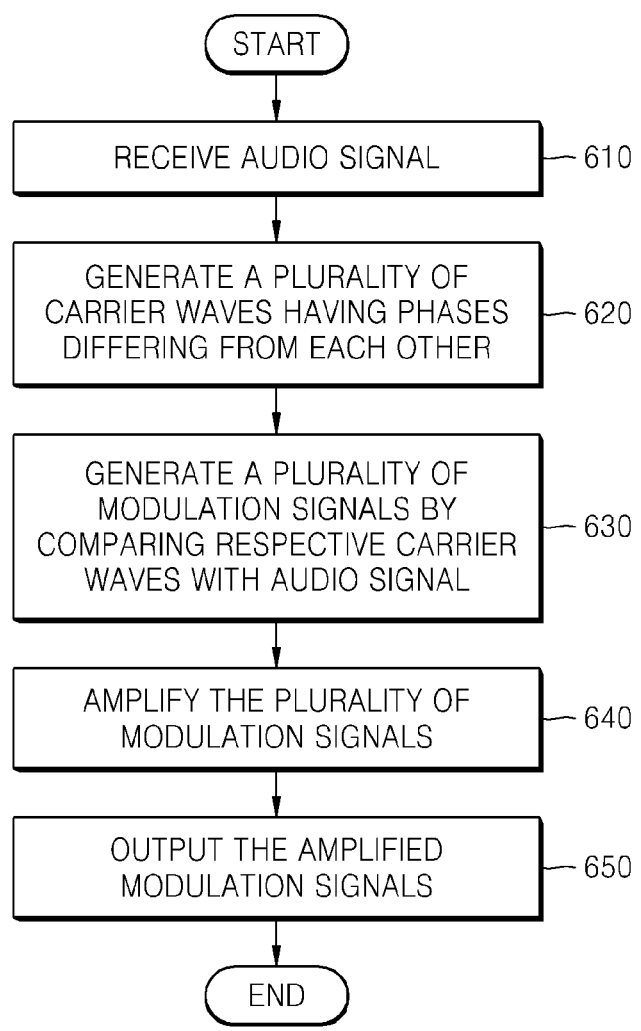
FIG. 6 is a flowchart illustrating a method of outputting an audio signal according to an exemplary embodiment.

FIG. 6 is a flowchart illustrating a method of outputting an audio signal according to an exemplary embodiment.

In operation 610, an audio signal is received.

In operation 620, a plurality of carrier waves, the phases of which differ from each other, are generated.

The number of the generated carrier waves may be determined based on a voltage magnitude of the received audio signal.

In operation 630, a plurality of modulation signals are generated by comparing the respective carrier waves with the audio signal.

In an exemplary embodiment, the modulation signals are generated such that high-level periods of the respective modulation signals partly overlap each other in a time domain.

In operation 640, the plurality of modulation signals are amplified.

In operation 650, the amplified modulation signals are outputted.

The above-described exemplary embodiments may be written as a program to be performed by a computer. By using a computer-readable recording medium, exemplary embodiments may be realized at a general-purpose computer which operates the program.

The computer-readable recording medium includes, but is not limited to, a magnetic storage medium (e.g., ROM, floppy disk, hard disk and the like) and an optical reading medium (e.g., CD-ROM, DVD and the like).

While exemplary embodiments have been particularly shown and described, it will be understood by those of ordinary skill in the art that various changes in form and details may be made therein without departing from the spirit and scope of the present invention as defined by the following claims.

What is claimed is:

1. A method of outputting amplified modulation signals from an audio signal, the method comprising:
   receiving the audio signal;
   generating a plurality of carrier waves based on a voltage of the received audio signal, each one of the carrier waves having a respective phase that differs from all other ones of the carrier waves;
   generating modulation signals by comparing each one of the carrier waves with the received audio signal;
   amplifying the modulation signals; and
   outputting the amplified modulation signals.

2. The method of claim 1, wherein first one of the modulation signals comprises a first logic level and a second logic level, and
   wherein the generating the modulation signals is performed such that first logic level periods of the first one of the modulation signals partly overlap with first logic level periods of a second one of the modulation signals in a time domain.

3. The method of claim 1, wherein the outputting the amplified modulation signals comprises outputting the amplified modulation signals through a speaker comprising audio output units that are provided for directly outputting respective ones of the amplified modulation signals.

4. The method of claim 1, further comprising:
   outputting the amplified modulation signals from voice coils; and
   synthesizing the amplified modulation signals that are outputted from the voice coils.

5. The method of claim 1, wherein the generating the carrier waves comprises:
   generating an initial carrier wave; and
   generating phase-shifted carrier waves,
   wherein a respective phase of each one of the phase-shifted carrier waves is shifted from a phase of the initial carrier wave by a predetermined respective phase shift, and
   wherein each one of the initial carrier wave and the phase-shifted waves has a phase that differs from all other ones of the initial carrier wave and the phase-shifted waves.

6. The method of claim 1, wherein the generating the carrier waves comprises generating a pair of carrier waves having a phase difference of 180 degrees therebetween.

7. The method of claim 1, wherein the generating the carrier waves comprises:
   determining a number of the carrier waves based on a voltage magnitude of the received audio signal; and
   generating the determined number of carrier waves.

8. The method of claim 1, wherein the modulation signals are pulse width modulation (PWM) signals.

9. The method of claim 1, wherein in the generating the modulation signals, the modulation signals are generated such that each one of the modulation signals comprises a first logic level when a voltage magnitude of a respective one of the carrier waves is equal to or smaller than a voltage magnitude of the audio signal, and such that each one of the modulation signals comprises a second logic level when a voltage magnitude of a respective one of the carrier waves is greater than a voltage magnitude of the audio signal.

10. An apparatus for outputting amplified modulation signals from an audio signal, the apparatus comprising:
    a receiving unit configured to receive the audio signal;
    a carrier wave generation unit configured to generate a plurality of carrier waves based on a voltage of the received audio signal, each one of the carrier waves having a respective phase that differs from all other ones of the carrier waves;
    a modulation signal generation unit configured to generate modulation signals by comparing each one of the carrier waves with the audio signal;
    an amplification unit configured to amplify the modulation signals; and
    an output unit configured to output the amplified modulation signals.

11. The apparatus of claim 10, wherein each one of the modulation signals comprises a first logic level and a second logic level, and
    wherein the modulation signal generation unit generates the modulation signals such that first logic level periods of a first one of the modulation signals partly overlap with first logic level periods of a second one of the modulation signals in a time domain.

12. The apparatus of claim 10, wherein the output unit comprises a speaker including audio output units configured to directly output the respective ones of the amplified modulation signals.

13. The apparatus of claim 10, wherein the output unit comprises a speaker including voice coils and an audio output unit,
- wherein the voice coils are configured to output respective ones of the amplified modulation signals, and
- wherein the audio output unit is configured to synthesize the amplified modulation signals outputted from the voice coils.

14. The apparatus of claim 10, wherein the carrier wave generation unit is configured to generate an initial carrier wave and to generate phase-shifted carrier waves,
- wherein a respective phase of each one of the phase-shifted carrier waves is shifted from a phase of the initial carrier wave by a predetermined respective phase shift, and
- wherein each one of the initial carrier wave and the phase-shifted waves has a phase that differs from all other ones of the initial carrier wave and the phase-shifted waves.

15. The apparatus of claim 10, wherein the carrier wave generation unit is configured to generate a pair of carrier waves having a phase difference of 180 degrees therebetween.

16. The apparatus of claim 10, wherein the modulation signals are PWM signals.

17. The apparatus of claim 10, wherein the modulation signal generation unit is configured to generate the modulation signals such that each one of the modulation signals has a first logic level when a voltage magnitude of a respective one of the carrier waves is equal to or smaller than a voltage magnitude of the audio signal, and such that each one of the modulation signals has a second logic level when a voltage magnitude of the respective one of the carrier waves is greater than a voltage magnitude of the audio signal.

18. The apparatus of claim 10, wherein the carrier wave generation unit is configured to determine a number of the carrier waves based on a voltage magnitude of the received audio signal, and
- wherein the carrier wave generation unit is configured to generate the determined number of carrier waves.

19. A non-transitory computer-readable recording medium storing a program for causing a computer to execute operations comprising:
- receiving an audio signal at a receiving unit;
- generating, by a carrier wave generation unit, a plurality of carrier waves based on a voltage of the received audio signal, each one of the carrier waves having a respective phase that differs from all other ones of the carrier waves;
- generating, by a modulation signal generation unit, modulation signals by comparing each one of the carrier waves with the audio signal;
- amplifying, by an amplification unit, the modulation signals; and
- outputting, by an output unit, the amplified modulation signals.

20. The apparatus of claim 17, wherein the output unit comprises a speaker apparatus including voice coils,
- wherein the voice coils are configured to output respective ones of the amplified modulation signals,
- wherein each one of the voice coils is configured such that, when a respective one of the modulation signals has the first logic level, the respective one of the voice coils outputs a respective one of the amplified modulation signals, and when the respective one of the modulation signals has the second logic level, the respective one of the voice coils does not output any signal.

21. The apparatus of claim 17, wherein the carrier wave generation unit generates a number of which equals the number of output units included in the output unit.

* * * * *